US009141074B2

(12) United States Patent
Watanabe

(10) Patent No.: US 9,141,074 B2
(45) Date of Patent: Sep. 22, 2015

(54) IMAGE FORMING APPARATUS HAVING SIDE COVER INCLUDING FINGER RECEIVING PORTION

(71) Applicant: Brother Kogyo Kabushiki Kaisha, Nagoya-shi, Aichi-ken (JP)

(72) Inventor: Yasunori Watanabe, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 23 days.

(21) Appl. No.: 13/663,961

(22) Filed: Oct. 30, 2012

(65) Prior Publication Data

US 2013/0106267 A1 May 2, 2013

(30) Foreign Application Priority Data

Oct. 31, 2011 (JP) ................................. 2011-238831

(51) Int. Cl.
*H05K 5/02* (2006.01)
*G03G 21/16* (2006.01)
*A47B 95/02* (2006.01)

(52) U.S. Cl.
CPC ............ *G03G 21/16* (2013.01); *G03G 21/1619* (2013.01)

(58) Field of Classification Search
CPC .......... G03G 21/1638; G03G 21/1628; G03G 21/1633; G03G 2221/169
See application file for complete search history.

(56) References Cited

U.S. PATENT DOCUMENTS 5,601,206 A * 2/1997 Haas et al. .................... 220/527
7,489,886 B2 2/2009 Ito
7,813,666 B2 * 10/2010 Sato ................................ 399/90
7,918,408 B2 * 4/2011 Tshieh .......................... 239/444
8,610,964 B2 12/2013 Watanabe (Continued)

FOREIGN PATENT DOCUMENTS

CN 1940742 A 4/2007
JP S58-116384 A 7/1983

(Continued)

OTHER PUBLICATIONS

Decision of Final Rejection mailed Jan. 28, 2014 in Japanese Application No. 2011-035486, English translation.

(Continued)

*Primary Examiner* — Clayton E LaBalle
*Assistant Examiner* — Victor Verbitsky
(74) *Attorney, Agent, or Firm* — Banner & Witcoff, Ltd.

(57) ABSTRACT

An image forming apparatus includes a pair of side covers, a finger receiving portion, a connection member, and a fitting member. One of the pair of side covers defines one of right and left outer side-surfaces of the image forming apparatus and the other defines the other of the right and left outer side-surfaces of the image forming apparatus. The finger receiving portion is inwardly recessed in each of the side covers with respect to a right-left direction and comprises an upper wall that has an insertion opening penetrating through the upper wall with respect to an top-bottom direction. The connection member is configured to connect the side covers with each other. The fitting member is a separate part from the connection member and is fitted to each of the finger receiving portions from an inner side of each of the side covers. The fitting member comprises a protrusion that protrudes downward therefrom. The protrusion protrudes downward from the upper wall of the finger receiving portion via the insertion opening.

12 Claims, 9 Drawing Sheets

(56) References Cited

U.S. PATENT DOCUMENTS

| | | | | |
|---|---|---|---|---|
| 2007/0071492 A1 | 3/2007 | Ito | | |
| 2009/0148179 A1* | 6/2009 | Tamura et al. | ................ | 399/107 |
| 2012/0002245 A1* | 1/2012 | Watanabe | ..................... | 358/471 |

FOREIGN PATENT DOCUMENTS

| | | | |
|---|---|---|---|
| JP | S59-32998 | Y2 | 9/1984 |
| JP | H04-93850 | U | 8/1992 |
| JP | H09-90688 | A | 4/1997 |
| JP | 2005-189752 | A | 7/2005 |
| JP | 2005-331065 | A | 12/2005 |
| JP | 2007-083672 | A | 4/2007 |
| JP | 2010-078901 | A | 4/2010 |
| JP | 2012-032766 | A | 2/2012 |

OTHER PUBLICATIONS

Notice of Reasons for Rejection mailed Nov. 12, 2013 in Japanese Application No. 2011-035486, English translation.

Notice of Allowance issued in corresponding U.S. Appl. No. 13/050,222 mailed Aug. 22, 2013.

Non-Final Office Action mailed Oct. 9, 2012 in U.S. Appl. No. 13/050,222.

CN Office Action mailed Sep. 3, 2013, CN Appln. 201110093451.0, English translation.

Jun 16, 2015—(JP) Notice of Reasons for Rejection—App 2011-238831, Eng Tran.

* cited by examiner

IMAGE FORMING APPARATUS HAVING SIDE COVER INCLUDING FINGER RECEIVING PORTION

CROSS-REFERENCE TO RELATED APPLICATION

This application claims priority to Japanese Patent Application No. 2011-238831, filed on Oct. 31, 2011, which is incorporated herein by reference.

TECHNICAL FIELD

Aspects of the disclosure relate to an image forming apparatus including a recessed finger receiving portion defined in a side surface of a housing of the image forming apparatus.

BACKGROUND

A known image forming apparatus includes a recessed finger receiving portion defined in a side surface of a housing thereof. In the known image forming apparatus, a nonslip member is fixed in each finger receiving portion by using an adhesive. With the provision of the nonslip members, the user hooks his/her fingers on the finger receiving portions when carrying the image forming apparatus, thereby reducing slipping of the user's fingers from the finger receiving portions.

SUMMARY

However, the following problems may arise in the known image forming apparatus. When fixing the nonslip member to the finger receiving portion, an assembler may need to take care to control an amount of adhesive to be applied to the nonslip member. The assembler may also need to position the nonslip member on an upper surface of the finger receiving portion with looking up at the upper surface before fixing the nonslip member to the finger receiving portion. Thus, an operation for fixing the nonslip member to the finger receiving portion may become complicated and thus productivity may not be increased.

Aspects of the disclosure provide for an image forming apparatus including configuration that may facilitate an operation for providing a nonslip portion in a finger receiving portion.

For example, aspects of the disclosure relates to an image forming apparatus which may include a pair of side covers, a finger receiving portion, a connection member, and a fitting member. One of the pair of side covers may define one of right and left outer side-surfaces of the image forming apparatus and the other may define the other of the right and left outer side-surfaces of the image forming apparatus. The finger receiving portion may be inwardly recessed in each of the side covers with respect to a right-left direction and comprise an upper wall that may have an insertion opening penetrating through the upper wall with respect to an top-bottom direction. The connection member may connect the side covers with each other. The fitting member may be a separate part from the connection member and may be fitted to each of the finger receiving portions from an inner side of each of the side covers. The fitting member may comprise a protrusion that may protrude downward therefrom. The protrusion may be configured to protrude downward from the upper wall of the finger receiving portion via the insertion opening when the fitting member is fitted to the finger receiving portion.

According to the aspects of the invention, an operation for providing a nonslip portion in the finger receiving portion may be facilitated.

Other objects, features, and advantages will be apparent to persons of ordinary skill in the art from the following detailed description of the disclosure and the accompanying drawings.

BRIEF DESCRIPTION OF THE DRAWINGS

For a more complete understanding of the present disclosure, needs satisfied thereby, and the objects, features, and advantages thereof, reference now is made to the following descriptions taken in connection with the accompanying drawing.

DETAILED DESCRIPTION OF EMBODIMENT

An illustrative embodiment is described in detail with reference to the accompanying drawings.

Figure 1:
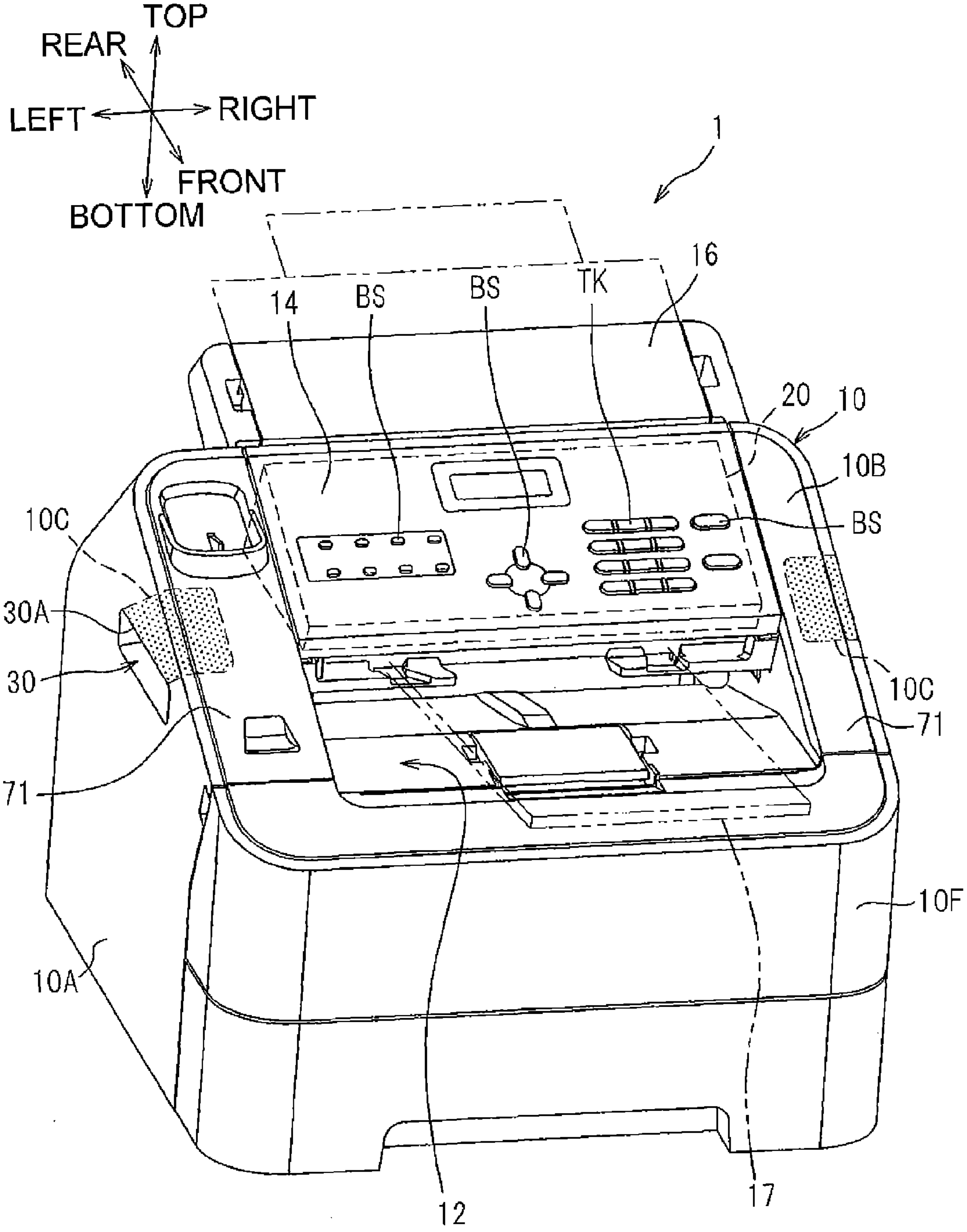
FIG. 1 is a perspective view depicting a multifunction peripheral in an illustrative embodiment according to one or more aspects of the disclosure.
Figure 2:
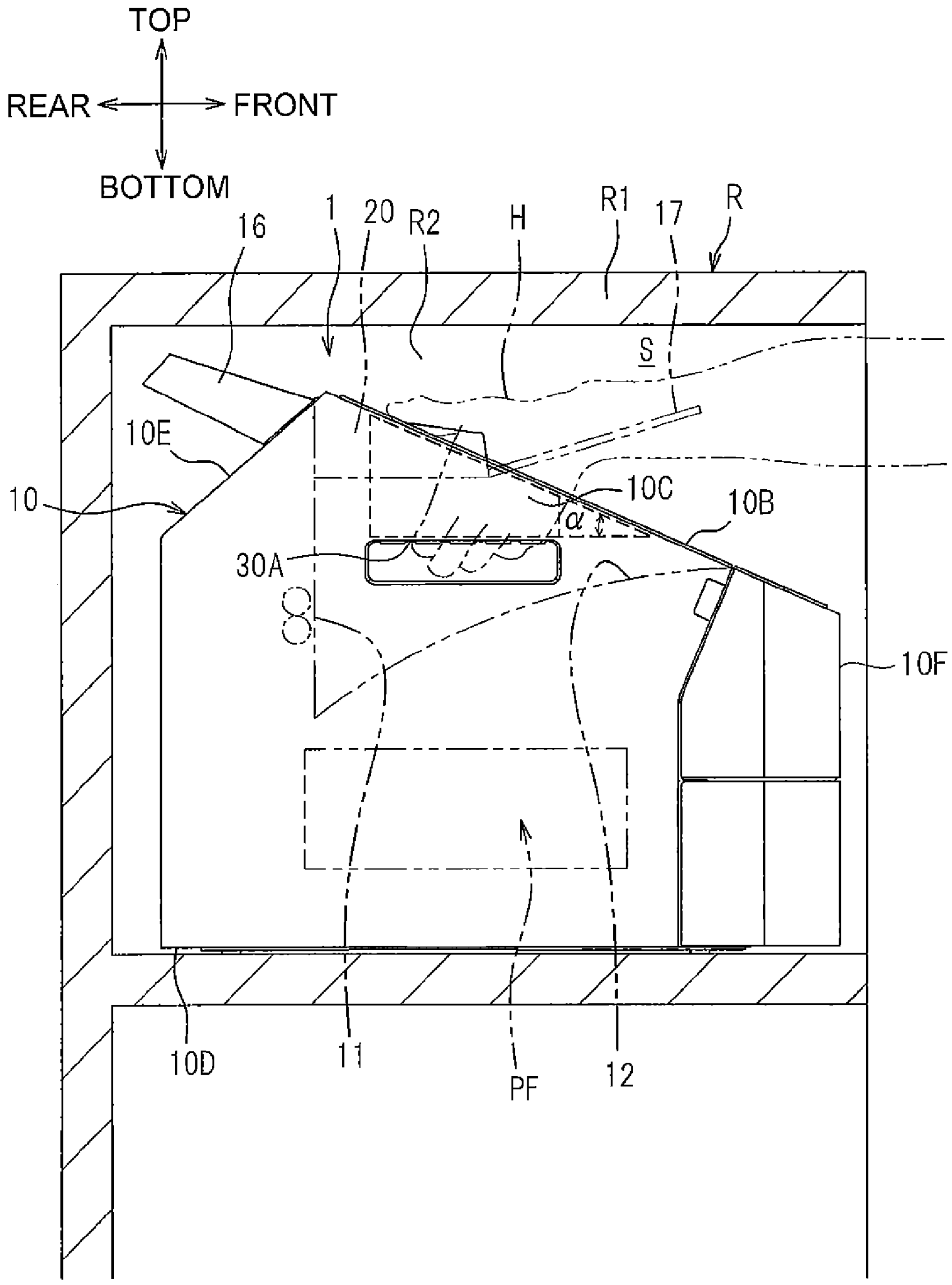
FIG. 2 is a side view of the multifunction peripheral placed in a shelf in the illustrative embodiment according to one or more aspects of the disclosure.

As depicted in FIG. 1, a multifunction peripheral 1 as an example of an image forming apparatus may comprise a housing 10, a document reader 20, and an image forming unit PF (see FIG. 2).

In the illustrative embodiment, the image forming unit PF may comprise a known photosensitive member and a known exposure device. A fixing device (not depicted) may be disposed downstream of the image forming unit PF with respect to a sheet conveying direction. The fixing device may be configured to fix an image onto a sheet by heat. The multifunction peripheral 1 may comprise a sheet discharge tray 12 disposed at an upper portion of the housing 10 and a discharge port 11 defined in the upper portion of the housing 10. As depicted in FIG. 2, after forming the image onto the sheet by the image forming unit PF and the fixing device, the multifunction peripheral 1 may be configured to discharge the sheet onto the sheet discharge tray 12 via the discharge port 11.

Figure 4:
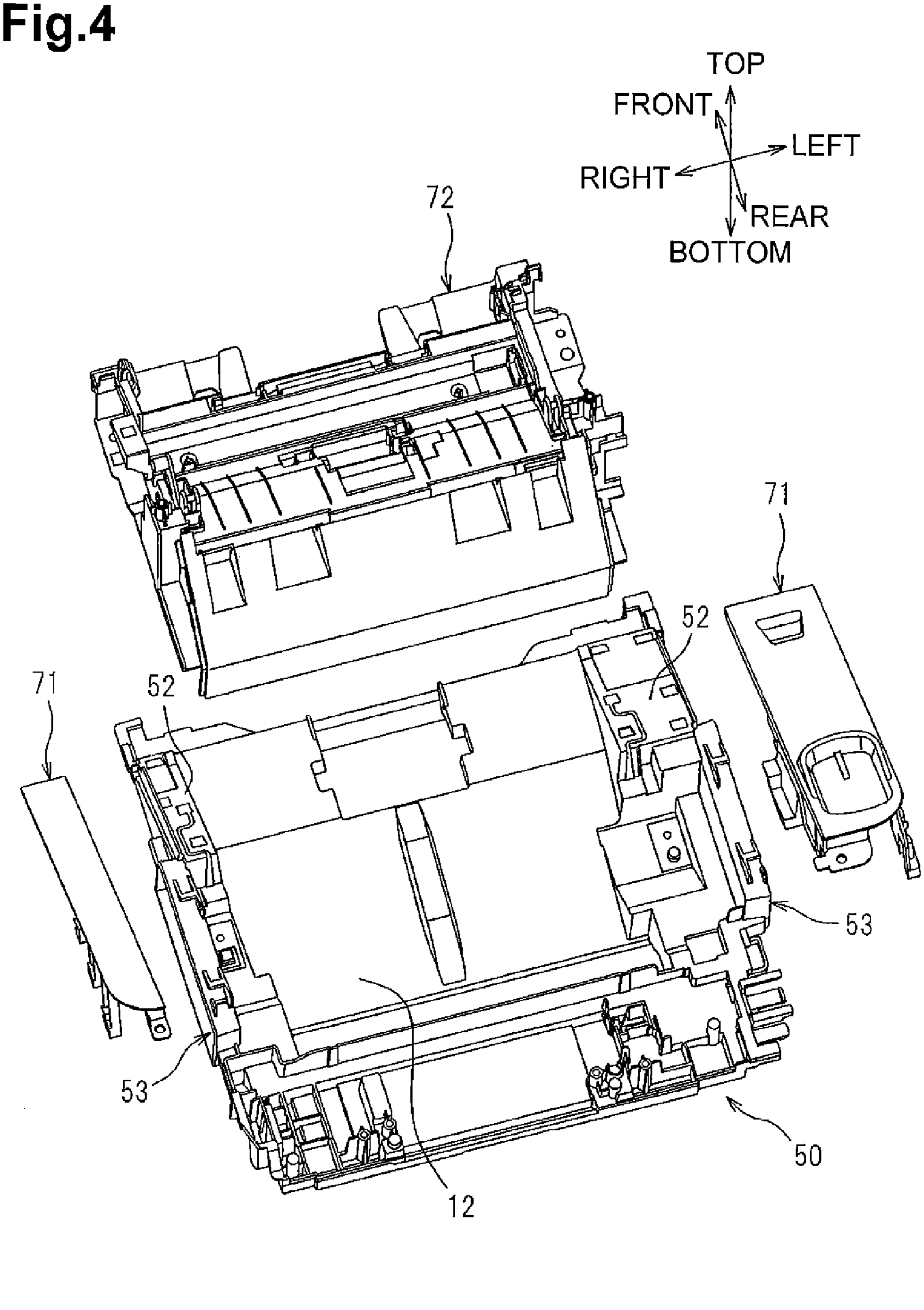
FIG. 4 is a perspective view depicting a connection member and a housing of a document reader in the illustrative embodiment according to one or more aspects of the disclosure.

A connection member 50 may be disposed above the image forming unit PF. The connection member 50 may have the discharge port 11 and comprise the sheet discharge tray 12. As depicted in FIG. 4, the connection member 50 may further comprise a side-wall portion 52 that may be disposed on each end of the connection member 50 with respect to a right-left direction. A cover 71 may be attached to an upper part of each side-wall portion 52. The covers 71 may define a part of an upper surface 10B of the housing 10.

A housing 72 of the document reader 20 may be attached to an upper rear part of the connection member 50. The document reader 20 may be configured to read an image from a document while conveying the document forward. The document reader 20 may be disposed below an upper wall 14 that may define a part of the upper surface 10B of the housing 10.

The upper wall 14 and the covers 71 may be inclined downward toward the front of the multifunction peripheral 1. As depicted in FIG. 2, the upper surface 10B may extend such that its rear end may be located at a position behind a middle part of the housing 10 with respect to a front-rear direction. The housing 10 may comprise a rear surface 10E that may extend from the rear end of the upper surface 10B and be inclined downward toward the rear of the multifunction peripheral 1. The housing 10 may comprise a front surface 10F that may extend from the front end of the upper surface 10B to a lower surface 10D of the multifunction peripheral 1. The upper part of the housing 10 may have a triangular shape having an upper vertex, which may be formed by an intersection of the upper surface 10B and the rear surface 10E, at a rearward position when viewed from the side of the multifunction peripheral 1.

As depicted in FIG. 1, a document feed tray 16 may be disposed behind the document reader 20 and may be configured to be retractable. The document reader 20 may be configured to read an image from a document fed from the the document feed tray 16. After that, the document reader 20 may be configured to discharge the read document onto a document discharge tray 17 disposed above the sheet discharge tray 12.

The housing 10 may comprise a finger receiving portion 30 at an upper part of each side surface 10A of the housing 10. The finger receiving portions 30 may be inwardly recessed with respect to the right-left direction. The upper surface 10B of the housing 10 may also be inclined toward the front of the multifunction peripheral 1. The finger receiving portion 30 may be disposed substantially in a middle position of each side surface 10A with respect to the front-rear direction and near the upper surface 10B of the housing 10. More specifically, the finger receiving portions 30 may be disposed at respective positions where a user may be able to hold the upper surface 10B and the finger receiving portions 30 at the same time by his/her hands. In the illustrative embodiment, the finger receiving portions 30 may be disposed below the document reader 20 and above the sheet discharge tray 12.

The connection member 50 may be disposed above the image forming unit PF. The connection member 50 may be configured not to support a high-voltage substrate (not depicted) nor a gear train (not depicted) for forming an image onto a sheet. This configuration may provide higher flexibility in design of the connection member 50 in which the finger receiving portions 30 may be formed. Thus, the finger receiving portion 30 may be disposed at an arbitrarily position in each side surface 10A of the housing 10. Accordingly, the multifunction peripheral 1 may be reduced in size.

As described above, the finger receiving portion 30 may be disposed at an arbitrarily position in each side surface 10A of the housing 10. In one embodiment, for example, each finger receiving portion 30 may be disposed at a position suitable for a hand size of a user who may be intended to use the multifunction peripheral 1 and have smallest-sized hands. That is, each finger receiving portion 30 may be disposed at a position where the user having the smallest-sized hands may be able to hook his/her fingers in the finger receiving portions 30 while holding the upper surface 10B of the housing 10. In another embodiment, for example, each finger receiving portion 30 may be disposed at a position suitable for a hand size of a user who may have normal-sized hands. That is, each finger receiving portion 30 may be disposed at a position where the user having the normal-sized hands may be able to hook his/her fingers in the finger receiving portions 30 while holding the upper surface 10B of the housing 10. More specifically, for example, each finger receiving portion 30 may be disposed such that the shortest distance between the upper surface 10B and the finger receiving portion 30 may become between 15 mm and 60 mm.

Here, it may be assumed that the multifunction peripheral 1 is placed in a shelf R having a narrow storage space, as depicted in FIG. 2. More specifically, it may be assumed that clearance between the housing 10 and each of an upper wall R1 and right and left walls R2 (one of the right and left walls R2 may be depicted in FIG. 2) of the shelf R is narrow. As described above, the upper surface 10B of the housing 10 may be inclined downward toward the front of the multifunction peripheral 1. Therefore, although the multifunction peripheral 1 is placed in the narrow space, the shelf R may still have space S left above the housing 10. Accordingly, the user may easily insert his/her entire hands H to the neighborhoods of the finger receiving portions 30 via the space S. Further, as described above, the finger receiving portion 30 may be disposed near the upper surface 10B in each side surface 10A of the housing 10. Therefore, the user may be allowed to easily hook his/her fingers in the respective finger receiving portions 30 by inserting the fingertips between the housing 10 and each of the right and left walls R2 of the shelf R. Accordingly, the user may easily take out the multifunction peripheral 1 from the narrow storage space of the shelf R.

The multifunction peripheral 1 may be placed in the narrow shelf R in a case where the user takes out the multifunction peripheral 1 from the shelf R only when use it, otherwise, stores the multifunction peripheral 1 away in the shelf R with its plug being removed from a socket.

Both of the finger receiving portions 30 may have the same configuration and thus a detailed description is made hereinafter with reference to only one of the finger receiving portions 30. The finger receiving portion 30 may comprise an upper surface 30A that may extend (horizontally) substantially parallel to a lower surface 10D of the housing 10. The housing 10 may further comprise handgrip portions 10C, each of which may be defined between a portion of the upper surface 10B of the housing 10 and the upper surface 30A of the finger receiving portion 30. When viewed from the side of the multifunction peripheral 1, the handgrip portion 10C may have a substantially triangular shape that may be fitted to a shape of a hand H when the user grasps the handgrip portion 10C, wherein two sides of the triangle may be defined by the portion of the inclined upper surface 10B of the housing 10 and the upper surface 30A of the finger receiving portion 30. With this configuration, the user may be allowed easier to grasp the handgrip portions 10C with his/her hands, and thus, may be allowed to readily take out the multifunction peripheral 1 from the shelf R. That is, in the human hand H, generally, the length of fingers from shorter to longer is a little finger, a third finger, and a middle finger in this order. Therefore, as depicted in FIG. 2, a triangle indicated with a dashed line may be formed by a line extending along the ball of the thumb, a line extending along fingertips of the middle finger, the third finger, and the little finger, and a line extending between these lines when the user closes his/her hand lightly. Thus, the palm of the user's hand H including the ball of the thumb and the fingertips of these fingers may be fitted along the handgrip portion 10C.

A tilt angle α of the upper surface 10B of the handgrip portion 10C with respect to the upper surface 30A of the finger receiving portion 30 may be arbitrarily determined. However, it may be preferable that the tilt angle α may generally be an acute angle for user's ease of holding. More specifically, for example, the tilt angle α of the upper surface 10B may be set to between 10° and 35°. However, the tilt angle α may not be not limited to the range described above but may be any angle if the user can easily hold the handgrip portion 10C.

As described above, the upper surface 30A of the finger receiving portion 30 may extend parallel to the lower surface 10D of the housing 10. Therefore, for example, the user may uplift the multifunction peripheral 1 from a floor while maintaining the lower surface 10D of the housing 10 parallel to the floor where the multifunction peripheral 1 was installed. Thus, this configuration may reduce a problem that the lower surface 10D of the multifunction peripheral 1 may hit the floor due to an inclination of the housing 10 when the user uplifts the multifunction peripheral 1.

As depicted in FIG. 1, the housing 10 may comprise a plurality of button switches BS and a plurality of numerical keys TK that may be disposed substantially on a middle part of the upper surface 10B with respect to the right-left direction. The user may use these button switches BS and numerical keys TK for controlling the multifunction peripheral 1. The handgrip portions 10C (indicated by a dotted line) having the substantially triangular shape in side cross-section may be disposed at respective positions outer than the button switches BS and the numerical keys TK with respect to the right-left direction. That is, in the handgrip portion 10C, the portion of the upper surface 10B of the housing 10 may be disposed at respective positions outer than the button switches BS and the numerical keys TK with respect to the right-left direction.

In addition, the button switches BS and the numerical keys TK may be disposed at respective positions inwardly spaced from each bottom wall 35 constituting each finger receiving portion 30 with respect to the right-left direction. Therefore, the handgrip portions 10C may be separated from the button switches BS and the numerical keys TK with respect to the right-left direction. With this configuration, the user may not touch the button switches BS nor the numeric keys TK with his/her hands or fingers when grasping the handgrip portions 10C. Thus, this configuration may reduce a risk of application of a load to the button switches BS and the numerical keys TK by one or more of the user's hands and fingers when the user carries the multifunction peripheral 1.

Each component or member constituting the housing 10 is now described in detail below.

Figure 3:
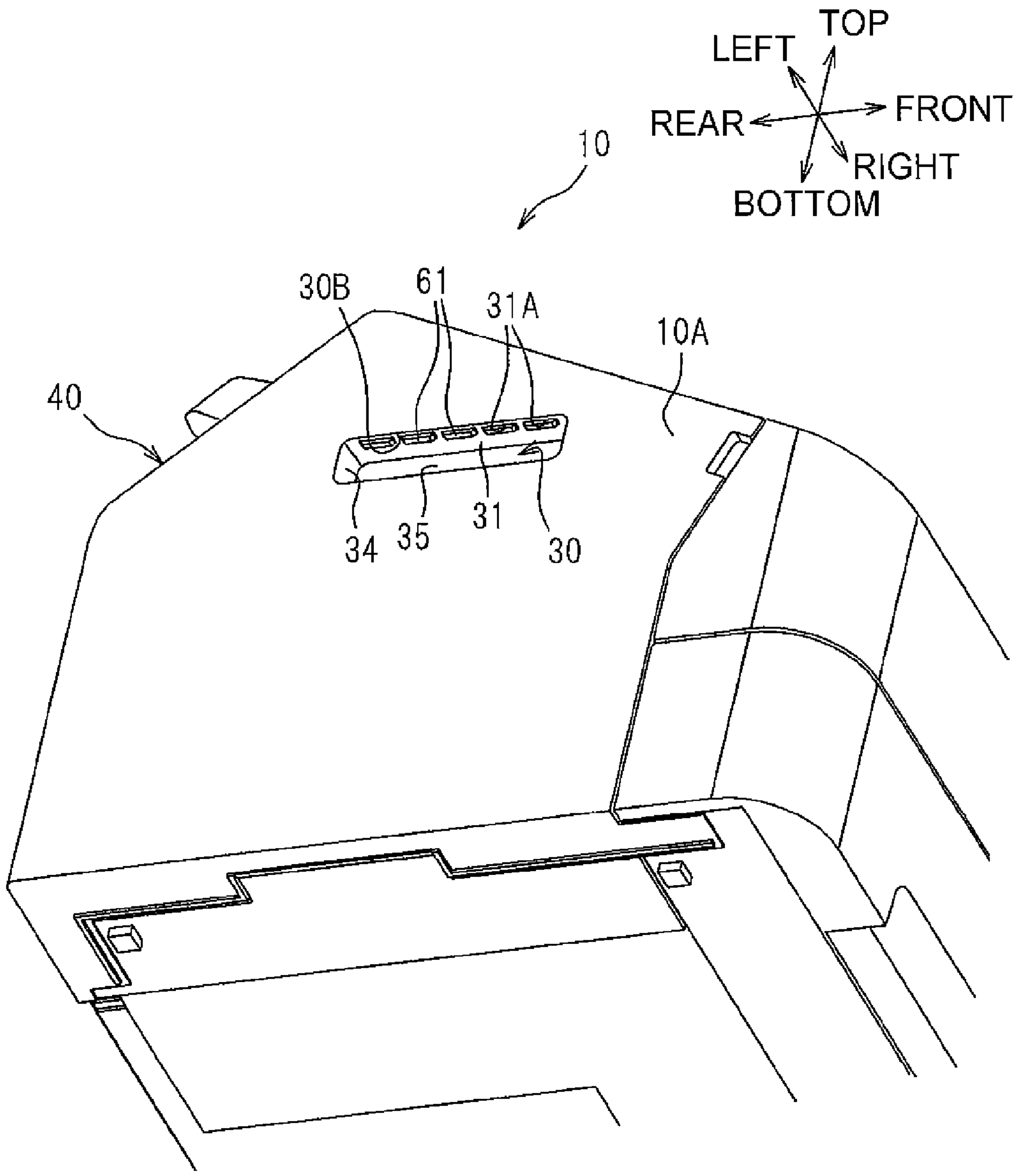
FIG. 3 is a perspective view depicting a finger receiving portion in the illustrative embodiment according to one or more aspects of the disclosure.
Figure 5:
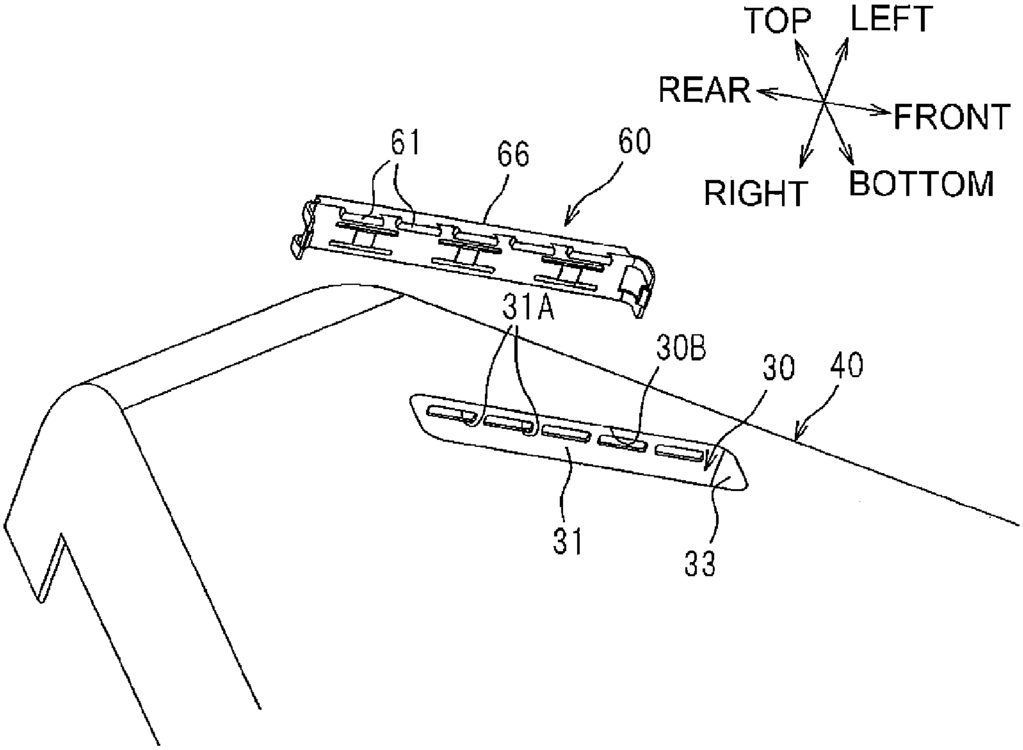
FIG. 5 is an exploded perspective view depicting of a fitting member and the finger receiving portion in the illustrative embodiment according to one or more aspects of the disclosure.

As depicted in FIGS. 3-5, the housing 10 may comprise a pair of right and left side covers 40 (only one of the side covers 40 may be depicted in FIGS. 3-5), the connection member 50, and fitting members 60. Each side cover 40 may comprise the finger receiving portion 30 defined therein. The connection member 50 may be configured to connect the side covers 40 with each other. The fitting members 60 may be separate parts from the connection member 50 and fitted to the respective finger receiving portions 30 from an inner side of each side cover 40.

Figure 6:
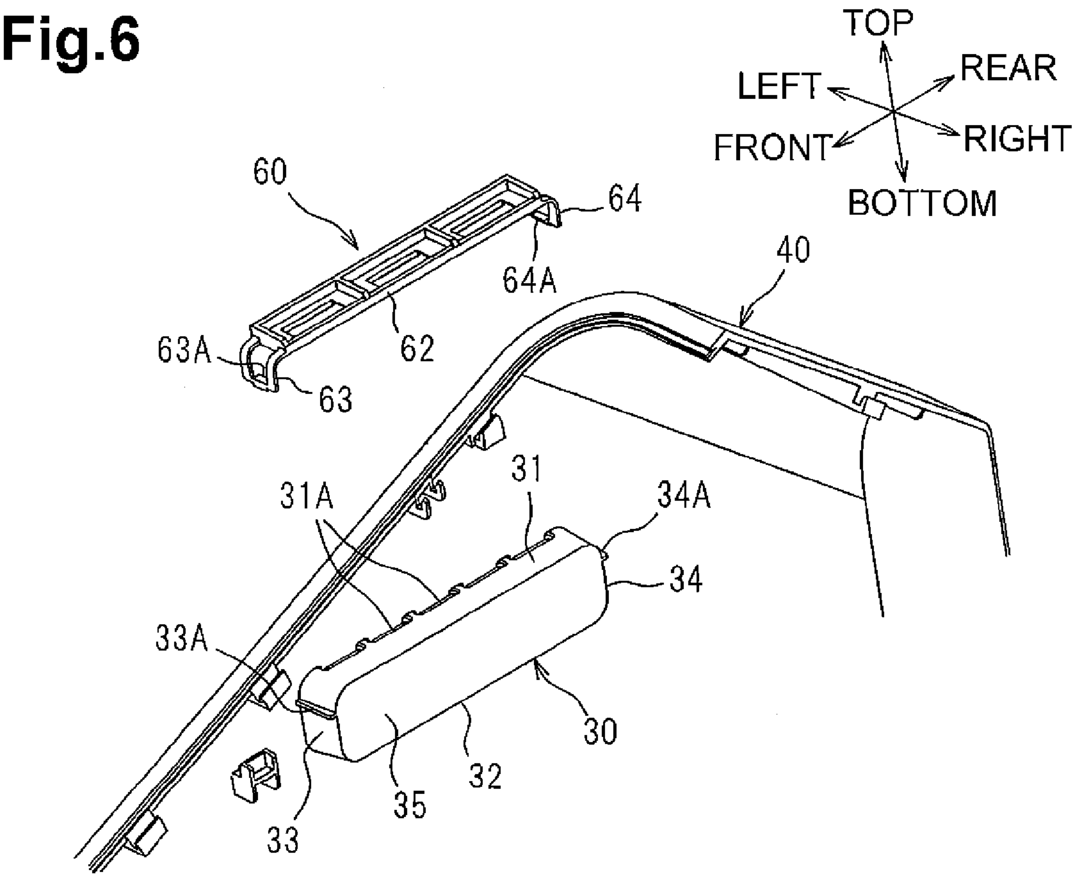
FIG. 6 is an exploded perspective view depicting the fitting member and the finger receiving portion in the illustrative embodiment according to one or more aspects of the disclosure.
Figure 7:
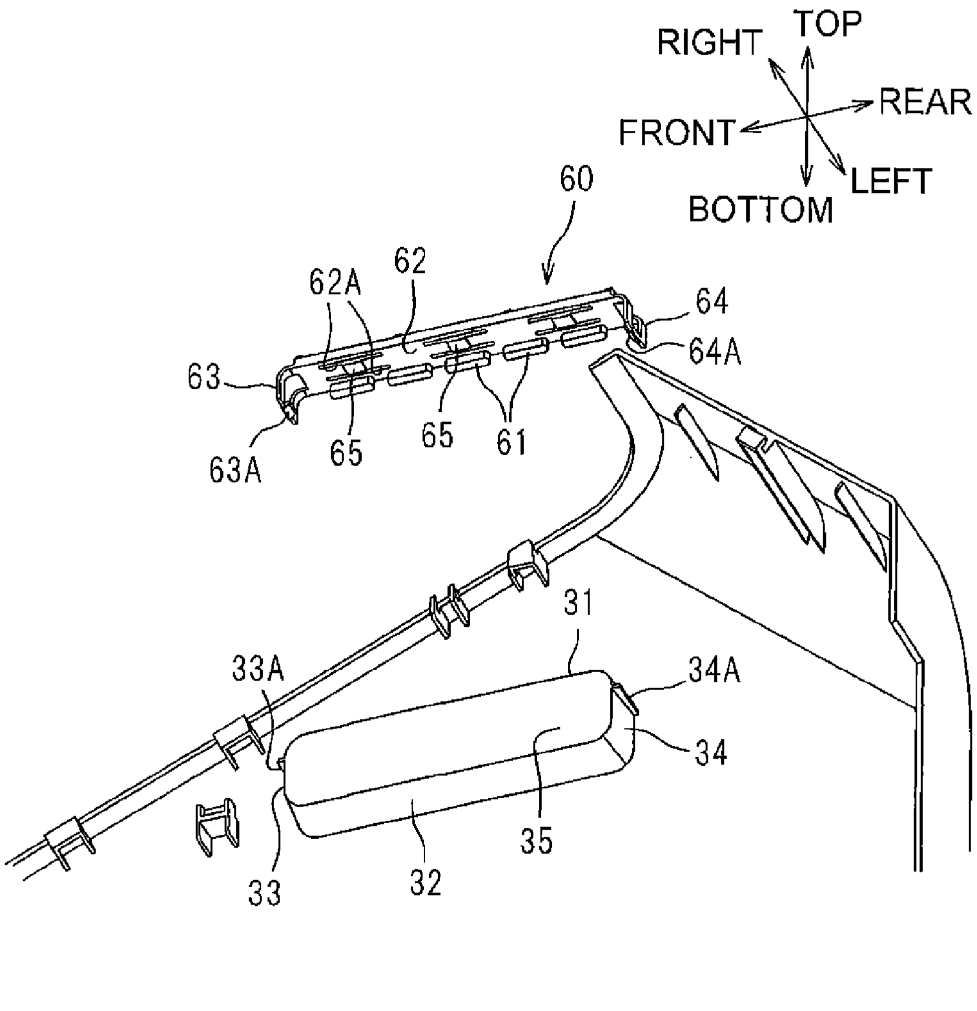
FIG. 7 is an exploded perspective view depicting the fitting member and the finger receiving portion in the illustrative embodiment according to one or more aspects of the disclosure.

The side covers 40 may define the right and left outer side-surfaces 10A, respectively, of the multifunction peripheral 1. Each side cover 40 may comprise the finger receiving portion 30 that may be inwardly recessed in the upper part of each side cover 40 with respect to the right-left direction. The finger receiving portion 30 may be a recess that may open outward into the side surface 10A with respect to the right-left direction. As depicted in FIGS. 5-7, the finger receiving portion 30 may comprise an upper wall 31, a lower wall 32, a front wall 33, a rear wall 34, and the bottom wall 35 (see FIG. 3). The side cover 40 may be inwardly hollowed with respect to the right-left direction to have the upper wall 31, the lower wall 32, the front wall 33, and the rear wall 34. The bottom wall 35 may connect inner ends of the walls 31-34 with each other.

The upper wall 31 of the finger receiving portion 30 may have a plurality of, for example, five, insertion openings 31A that may penetrate therethrough in an top-bottom direction. The fitting member 60 may comprise a plurality of, for example, five, protrusions 61 that may protrude downward therefrom and correspond to the insertion openings 31A, respectively. As depicted in FIG. 3, when the fitting member 60 is fitted to the finger receiving portion 30, the protrusions 61 of the fitting member 60 may protrude downward from the upper wall 31 of the finger receiving portion 30 via the corresponding insertion openings 31A.

As described above, when the fitting member 60 is fitted to the finger receiving portion 30, the protrusions 61 may protrude from the corresponding insertion openings 31A and serve as a nonslip potion in the finger receiving portion 30. Therefore, this configuration may facilitate an operation for providing the nonslip portion in the finger receiving portion 30. Further, the plurality of protrusions 61 may be provided in the finger receiving portion 30. Therefore, the user may hook his/her fingers on the protrusions 61 easily. Accordingly, the nonslip portion may exert its effect more effectively.

The plurality of insertion openings 31A may be provided corresponding to the number of protrusions 61 and independent of one another. Therefore, this configuration may increase stiffness of the finger receiving portion 30 as compared with a case where all of a plurality of protrusions may be inserted into a single insertion opening having a size corresponding to the plurality of protrusions. Thus, this configuration may reduce deformation of the finger receiving portions 30 that may be caused when the user uplifts the multifunction peripheral 1 while holding the finger receiving portions 30 with his/her fingers.

The insertion openings 31A may be spaced at predetermined intervals along an edge 30B of the recessed finger receiving portion 30. The interval between each insertion opening 31A may be narrower than the breadth of a finger of the user. Therefore, when the fitting member 60 is fitted to the finger receiving portion 30, the protrusions 61 that may protrude downward from the corresponding insertion openings 31A may also be spaced at predetermined intervals along the edge 30B of the recessed finger receiving portion 30. The interval between each protrusion 61 may be narrower than the breadth of the finger of the user.

The predetermined interval between each protrusion 61 may be arbitrarily determined. For example, in other embodiments, the interval between each protrusion 61 may be narrower than the breadth of a finger of a user who may be intended to use the multifunction peripheral 1 and have the smallest fingers. In still other embodiments, the interval between each protrusion 61 may be narrower than the breadth of a finger of a user who may have normal-sized fingers.

The interval between each protrusion 61 may be determined as described above. Therefore, when the user places his/her fingers on the finger receiving portions 30, the above configuration may reduce passing of the fingers between the protrusions 61 without the user's fingers hooking on the protrusions 61. Thus, the user may reliably hook his/her fingers on the protrusions 61 and the nonslip portion may exert its effect with reliability.

A distance between the insertion openings 31A and the bottom wall 35 of the finger receiving portion 30 (i.e., a depth with respect to the right-left direction) may be greater than a length between a fingertip and at least a first finger joint of the user. Therefore, a distance between the bottom wall 35 and the protrusions 61 that may protrude downward from the corresponding insertion openings 31A may also be greater than the length between the fingertip and at least the first finger joint of the user when the fitting member 60 is fitted to the finger receiving portion 30.

The distance between the protrusions 61 and the bottom wall 35 may be arbitrarily determined. For example, in other embodiments, the distance between the protrusions 61 and the bottom wall 35 may be greater than a length between a fingertip and a first finger joint of a user who may be intended to use the multifunction peripheral 1 and have the largest fingers. In still other embodiments, for example, the distance between the protrusions 61 and the bottom wall 35 may be greater than a length between a fingertip and a first finger joint of a user who may have normal-sized fingers.

The distance between the protrusions 61 and the bottom wall 35 may be determined as described above. Therefore, the user may reliably insert his/her fingers into the finger receiving portion 30 until at least parts of the fingers above the first finger joints may be placed between the protrusions 61 and the bottom wall 35. Thus, the user may reliably hook his/her fingers on inner surfaces of the protrusions 61.

As depicted in FIG. 4, the connection member 50 may comprise a substantially plate-shaped member that may extend along the right-left direction. The connection member 50 may have a recessed portion 53 defined in each end surface of the connection member 50 with respect to the right-left direction. In each end surface of the connection member 50, the recessed portion 53 may be disposed at a substantially middle position with respect to the front-rear direction. The recessed portion 53 may have a size slightly larger than the finger receiving portion 30 to hold the corresponding finger receiving portion 30 therein.

Figure 8:
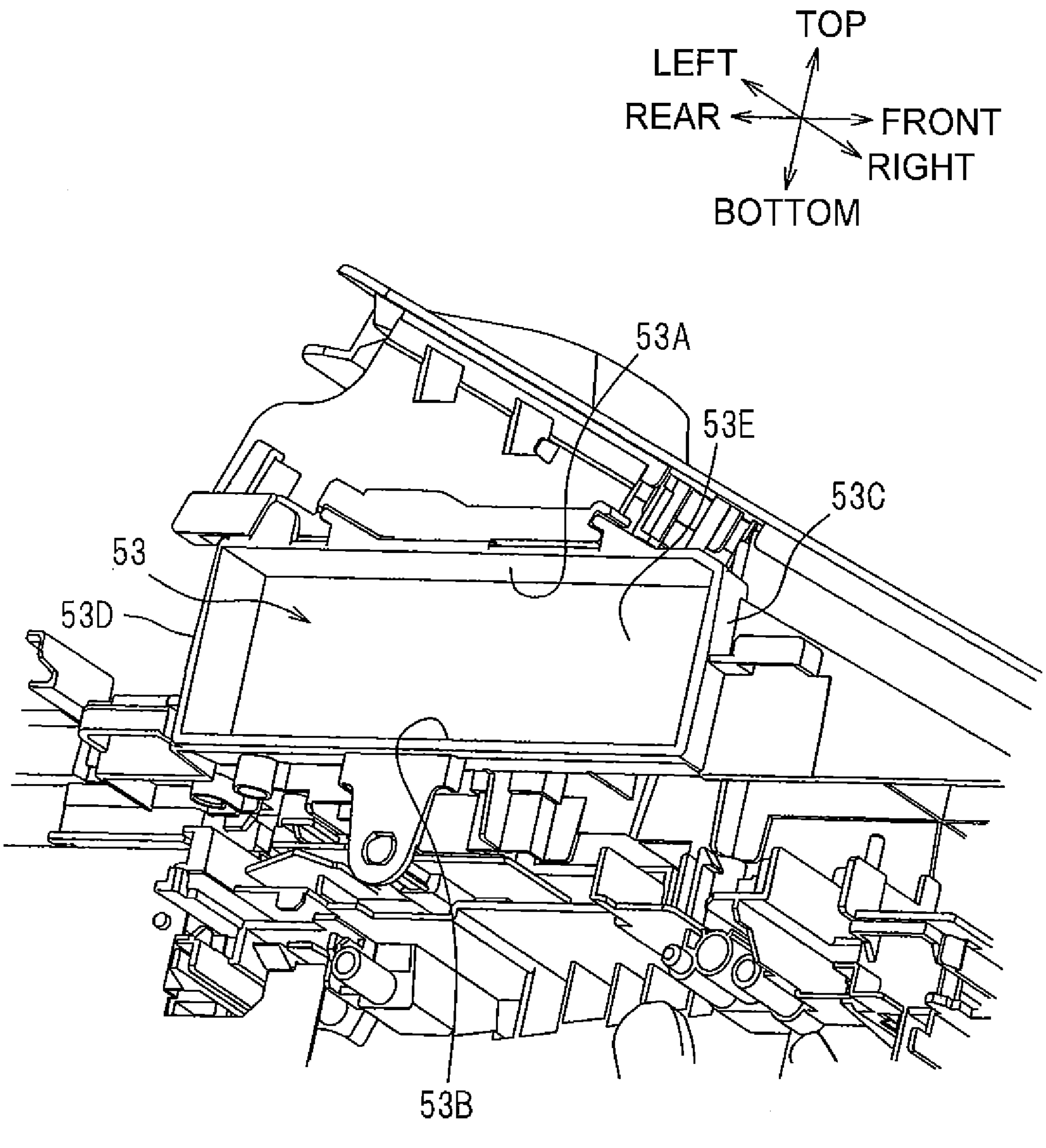
FIG. 8 is a perspective view depicting the connection member in the illustrative embodiment according to one or more aspects of the disclosure.
Figure 9:
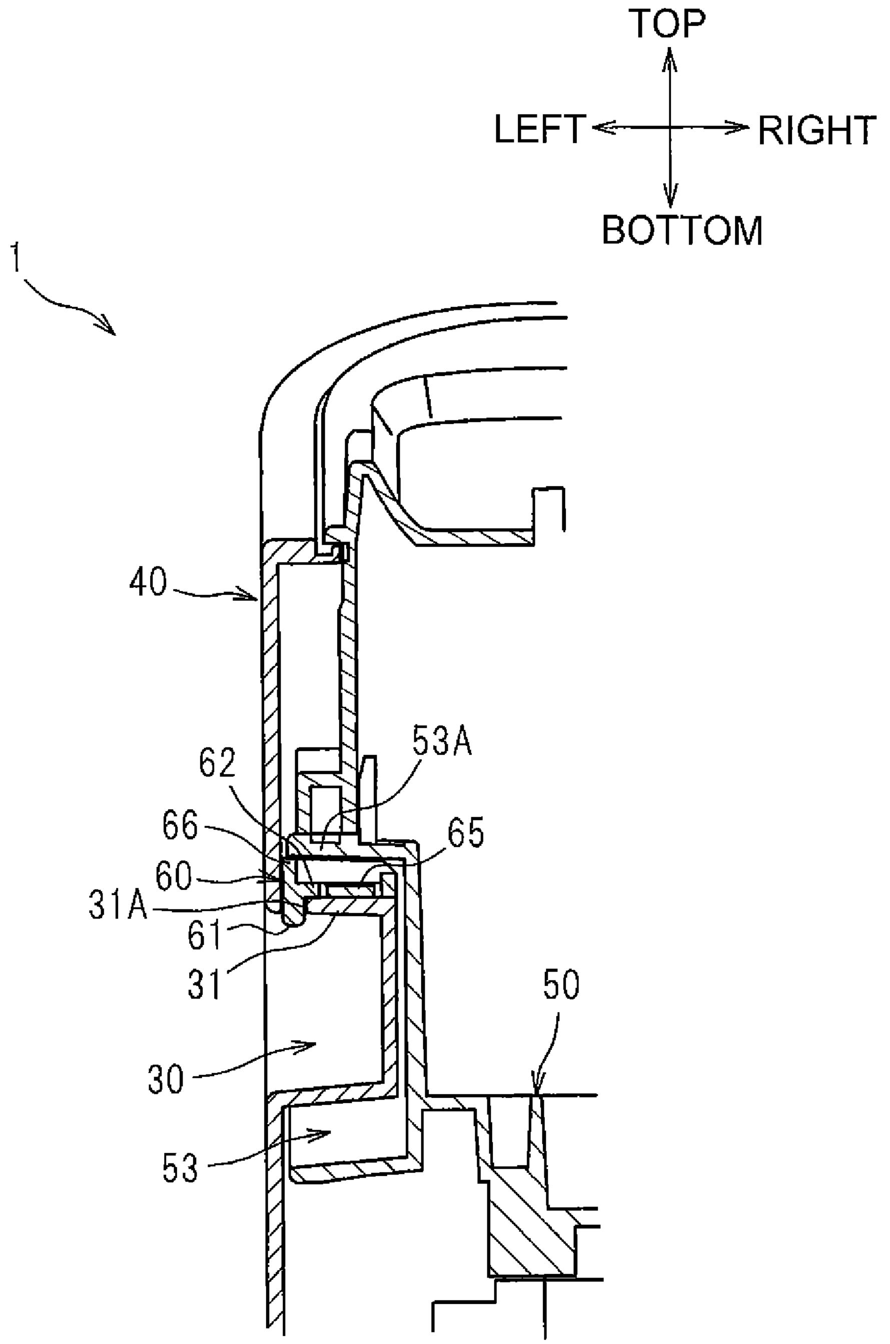
FIG. 9 is a sectional view depicting a structure of the finger receiving portion and its surroundings in the illustrative embodiment according to one or more aspects of the disclosure.

The recessed portions 53 may open outward into the respective end surfaces of the connection member 50 with respect to the right-left direction. As depicted in FIG. 8, each recessed portion 53 may comprise an upper wall 53A, a lower wall 53B, a front wall 53C, a rear wall 53D, and a bottom wall 53E. The connection member 50 may be configured to connect the side covers 40 with each other while the finger receiving portions 30 are located in the respective recessed portions 53. Therefore, as depicted in FIG. 9, the fitting member 60 may be held in each side of the connection member 50 while being interposed between the upper wall 31 of the finger receiving portion 30 and the upper wall 53A of the recessed portion 53.

Accordingly, this configuration may not require any fastener for fixing the fitting member 60 to the finger receiving portion 30, for example, screws, and thus may accomplish cost reduction.

As depicted in FIG. 7, the fitting member 60 may comprise a base portion 62, a front wall portion 63 and a rear wall portion 64. The fitting member 60 may be made of resin. The base portion 62 may have an elongated shape with respect to the front-rear direction. The front wall portion 63 and the rear wall portion 64 may extend downward from front and rear ends of the base portion 62, respectively.

The base portion 62 may comprise the protrusions 61 at one of right and left edges of the base portion 62 with respect to the right-left direction. The base portion 62 may further comprise a spring 65 that may be disposed at a substantially middle position with respect to the right-left direction. The spring 65 may be integral with the base portion 62. The spring 65 may be an example of an elastic member that may be configured to be deformable with respect to the top-bottom direction. The base portion 62 may have slits 62A therein on both right and left sides of the spring 65. With this configuration, the spring may be configured to be deformable independently from other parts of the base portion 62. Further, a middle portion of the spring 65 with respect to the front-rear direction may protrude downward.

In this illustrative embodiment, the base portion 62 may comprise a plurality of, for example, three, springs 65 that may be spaced apart from each other with respect to the front-rear direction. As depicted in FIG. 9, when the fitting member 60 is interposed between the upper wall 31 of the finger receiving portion 30 and the upper wall 53A of the recessed portion 53, the springs 65 may be deformed in contact with the upper wall 31 of the finger receiving portion 30. In this state, the springs 65 may be configured to urge the fitting member 60 toward the upper wall 53A of the recessed portion 53.

Thus, the fitting member 60 may be urged against the upper wall 53A of the recessed portion 53 by the action of the springs 65. Therefore, the provision of the springs 65 may reduce rattling of the fitting member 60 in the finger receiving portion 30 with respect to the top-bottom direction.

In this illustrative embodiment, the base portion 62 may further comprise a protruding wall 66 that may protrude upward from the one of the right and left edge at which the plurality of protrusions 61 are disposed. The protruding wall 66 may extend along the front-rear direction, that is, across an area in which the plurality of protrusions 61 are disposed (see FIG. 5). An upper end of the protruding wall 66 may be configured to come into contact with the upper wall 53A of the recessed portion 53 when the fitting member 60 is interposed between the upper wall 31 of the finger receiving portion 30 and the upper wall 53A of the recessed portion 53.

With this configuration, in a case where a force acts upward on the protrusions 61 from the fingers when the user hooks his/her fingers on the finger receiving portions 30 and uplifts the multifunction peripheral 1, the protruding wall 66 disposed over the protrusions 61 may come into contact with the upper wall 53A of the recessed portion 53. With this configuration, the deformation of the base portion 62 may be reduced. Further, the reduction of the deformation of the base portion 62 may surely reduce an undesired retraction of the protrusions 61 into the insertion openings 31A.

As depicted in FIGS. 6 and 7, the front wall portion 63 and the rear wall portion 64 may comprise engaging pieces 63A, 64A, respectively, at their lower parts. The engaging pieces 63A, 64A may be an example of an engaging portion that may protrude inward with respect to the front-rear direction. The front wall 33 and the rear wall 34 of the finger receiving portion 30 may comprise engaged pieces 33A, 34A that may protrude outward with respect to the front-rear direction. The engaged pieces 33A, 34A may be an example of an engaged portion that may be engaged with the engaging piece 63A, 64A.

With this configuration, the fitting member 60 may be temporarily fitted to the finger receiving portion 30 by engagement of the engaging pieces 63A, 64A and the engaged pieces 33A, 34A. After that, the fitting member 60 may be pinched between the upper wall 31 of the finger receiving portion 30 and the connection member 50. Thus, an operation for fitting the fitting member 60 may be further facilitated.

According to the above-described illustrative embodiment, the following effects may also be obtained in addition to the effects described above.

As described above, the fitting member 60 that may be far smaller than the connection member 50 may be fitted to the finger receiving portion 30. Therefore, the protrusions 61 of the fitting member 60 may be readily inserted into the corresponding insertion openings 31A and thus the fitting operation may be facilitated. Further, the fitting member 60 and the connection member 50 may be separate parts. Therefore, in other embodiments, for example, the fitting member 60 and the connection member 50 may be made of different materials, for example, slip-resistant material or material having higher stiffness.

While the invention has been described in detail with reference to the specific embodiment thereof, it would be apparent to those skilled in the art that various changes, arrangements and modifications may be applied therein without departing from the spirit and scope of the invention.

In the above-described illustrative embodiment, as an example of the elastic member, the springs 65 that may be integral with the fitting member 60 has been described. Nevertheless, the invention may not be limited to the specific embodiment. In other embodiments, for example, leaf springs, wire springs, coil springs or the like that may be separately provided from the fitting member may be adopted for the elastic member. In the above-described illustrative embodiment, the fitting member 60 may be urged toward the connection member 50 (i.e., the upper wall 53A of the recessed portion 53) by the elastic member (e.g., the springs 65). Nevertheless, the invention may not be limited to the specific embodiment. In other embodiments, for example, as opposed to the illustrative embodiment, the fitting member 60 may be urged toward the upper wall 30A of the finger receiving portion 30 by the elastic member.

In the illustrative embodiment, all members and portions (e.g., the cover 71 and the upper wall 14) constituting the upper surface 10B of the housing 10 may be inclined downward toward the front of the multifunction peripheral 1. Nevertheless, the invention may not be limited to the specific embodiment. In other embodiments, for example, only one or more of the members and portions constituting the handgrip portions 10C, for example, only the covers 71, may be inclined downward toward the front of the multifunction peripheral 1.

In the illustrative embodiment, the finger receiving portions 30 may be disposed between the sheet discharge tray 12 and the document reader 20. Nevertheless, the invention may be not limited to the specific embodiment. In other embodiments, for example, the finger receiving portions 30 may be disposed at the level where the finger receiving portions 30 may overlap one of the document reader 20 and the sheet discharge tray 12 with respect to the right-left direction.

In the illustrative embodiment, the plurality of protrusions 61 and the plurality of insertion openings 31A may be provided. Nevertheless, the invention may be not limited to the specific embodiment. In other embodiments, for example, a single protrusion and a single insertion opening may be provided. In still other embodiments, for example, a plurality of protrusions and a single insertion opening into which the plurality of protrusions may be inserted.

In the illustrative embodiment, both of the engaging pieces 63A, 64A and the engaged pieces 33A, 34A that may be examples of the engaging portion and the engaged portion may be protrudingly provided. Nevertheless, the invention may be not limited to the specific embodiment. In other embodiments, for example, one of the engaging portion and the engaged portion may be a protrusion and the other may be a recess.

In the illustrative embodiment, the invention may be applied to the multifunction peripheral 1. Nevertheless, the invention may be not limited to the specific embodiment. In other embodiments, for example, the invention may be applied to not only multifunction peripherals but also other image forming apparatus, for example, printers or copying machines, or any other suitable machine.

What is claimed is:

1. An image forming apparatus, comprising:
- a pair of side covers defining outer side-surfaces of the image forming apparatus, each side cover comprising:
  - a finger receiving portion recessed in an inner direction of the image forming apparatus and comprising a side wall having a front wall, a rear wall and a bottom wall, and a lower wall, the side wall extending from the lower wall; and
  - a fitting member comprising a base portion and a protrusion protruding from the base portion in a downward direction, wherein the base portion contacts the side wall of the finger receiving portion; and
- a connection member connecting the side covers with each other,
- wherein the finger receiving portion further comprises an upper wall that has an insertion opening through which the protrusion protrudes, the upper wall contacting the side wall, and
- wherein the fitting member is held between the upper wall of the finger receiving portion and the connection member.

2. The image forming apparatus according to claim 1, further comprising an elastic member configured to urge the fitting member toward one of the upper wall of the finger receiving portion and the connection member.

3. The image forming apparatus according to claim 1,
- wherein the fitting member is fitted to each of the finger receiving portions from an inner side of each of the side covers, and
- wherein the connecting member comprises a recessed portion that covers the finger receiving portion and the fitting member from the inner side of the side cover.

4. The image forming apparatus according to claim 1,
- wherein the fitting member further comprises an engaging portion,
- wherein the finger receiving portion further comprises an engaged portion, protruding outward from the finger receiving portion, and
- wherein the fitting member is fitted to the finger receiving portion by engaging the engaging portion with the engaged portion.

5. The image forming apparatus according to claim 2, wherein the elastic member is formed integrally with the fitting member.

6. An image forming apparatus, comprising:
- a pair of side covers defining outer side-surfaces of the image forming apparatus, each side cover comprising:
  - a finger receiving portion recessed in an inner direction of the image forming apparatus and comprising a side wall having a front wall, a rear wall and a bottom wall, and a lower wall, the side wall extending from the lower wall; and a fitting member comprising a base portion and a protrusion protruding from the base portion in a downward direction, wherein the base portion contacts the side wall of the finger receiving portion; and a connection member connecting the side covers with each other, wherein the fitting member is fitted to each finger receiving portion from an inner side of each of the side covers, and wherein the connecting member comprises a recessed portion that covers the finger receiving portion and the fitting member from the inner side of the side cover.

7. The image forming apparatus according to claim 6, wherein the finger receiving portion further comprises an upper wall that has an insertion opening through which the protrusion protrudes, the upper wall contacting the side wall, and wherein the fitting member is held between the upper wall of the finger receiving portion and the connection member.

8. The image forming apparatus according to claim 7, further comprising an elastic member configured to urge the fitting member toward one of the upper wall of the finger receiving portion and the connection member.

9. The image forming apparatus according to claim 8, wherein the elastic member is formed integrally with the fitting member.

10. The image forming apparatus according to claim 6, wherein the fitting member further comprises an engaging portion, wherein the finger receiving portion further comprises an engaged portion, protruding outward from the finger receiving portion, and wherein the fitting member is fitted to the finger receiving portion by engaging the engaging portion with the engaged portion.

11. The image forming apparatus according to claim 10, wherein the finger receiving portion further comprises an upper wall that has an insertion opening through which the protrusion protrudes, the upper wall contacting the side wall.

12. The image forming apparatus according to claim 6, wherein the finger receiving portion further comprises an upper wall that has an insertion opening through which the protrusion protrudes, the upper wall contacting the side wall.

* * * * *